(12) United States Patent
Liu et al.

(10) Patent No.: US 8,912,538 B2
(45) Date of Patent: Dec. 16, 2014

(54) THIN FILM TRANSISTOR ARRAY SUBSTRATE AND METHOD FOR MANUFACTURING THE SAME

(71) Applicant: Boe Technology Group Co., Ltd., Beijing (CN)

(72) Inventors: Xiang Liu, Beijing (CN); Woobong Lee, Beijing (CN)

(73) Assignee: Boe Technology Group Co., Ltd., Beijing (CN)

( * ) Notice: Subject to any disclaimer, the term of this patent is extended or adjusted under 35 U.S.C. 154(b) by 0 days.

(21) Appl. No.: 13/822,480

(22) PCT Filed: Dec. 17, 2012

(86) PCT No.: PCT/CN2012/086772
§ 371 (c)(1),
(2), (4) Date: Mar. 12, 2013

(87) PCT Pub. No.: WO2013/170605
PCT Pub. Date: Nov. 21, 2013

(65) Prior Publication Data
US 2014/0103333 A1    Apr. 17, 2014

(30) Foreign Application Priority Data

May 18, 2012  (CN) .......................... 2012 1 0157572
Jun. 4, 2012   (CN) .......................... 2012 1 0181618

(51) Int. Cl.
*H01L 29/10*    (2006.01)
*H01L 29/12*    (2006.01)
(Continued)

(52) U.S. Cl.
CPC ............ *H01L 27/127* (2013.01); *G02F 1/1368* (2013.01);
(Continued)

(58) Field of Classification Search
CPC ............ H01L 27/3262; H01L 29/786; H01L 29/4908; H01L 29/66757; H01L 2021/775

USPC ............... 257/43, 59, 72, E21.411, E29.117, 257/E29.151, E29.202, E29.273; 438/149, 438/158, 159

See application file for complete search history.

(56) References Cited

U.S. PATENT DOCUMENTS 5,903,326 A     5/1999  Lee
6,532,050 B1 *  3/2003  Kim et al. .................... 349/106
(Continued)

FOREIGN PATENT DOCUMENTS

CN    101542742 A    9/2009
CN    101626036 A    1/2010
(Continued)

OTHER PUBLICATIONS

International Search Report mailed Mar. 28, 2013; PCT/CN2012/086772.

(Continued)

*Primary Examiner* — Ida M Soward
(74) *Attorney, Agent, or Firm* — Ladas & Parry LLP

(57) ABSTRACT

Embodiments of the present invention provide a thin film transistor array substrate, a method for manufacturing the same, a display panel and a display device. The method for manufacturing the thin film transistor array substrate comprises: sequentially depositing a first metal oxide layer, a second metal oxide layer and a source and drain metal layer, conductivity of the first metal oxide layer being smaller than conductivity of the second metal oxide layer; patterning the first metal oxide layer, the second metal oxide layer and the source and drain metal layer, so as to form an active layer, a buffer layer, a source electrode and a drain electrode, respectively. According to technical solutions of the embodiments of the invention, it is possible that the manufacturing process of the metal oxide TFT array substrate is simplified, and the production cost of products is reduced.

19 Claims, 4 Drawing Sheets

(51) Int. Cl.
*H01L 29/04* (2006.01)
*H01L 31/036* (2006.01)
*H01L 31/0376* (2006.01)
*H01L 31/20* (2006.01)
*H01L 29/15* (2006.01)
*H01L 21/00* (2006.01)
*H01L 21/84* (2006.01)
*G02F 1/1368* (2006.01)
*H01L 29/786* (2006.01)
*H01L 27/12* (2006.01)

(52) U.S. Cl.
CPC ..... *H01L 29/78618* (2013.01); *H01L 27/1225* (2013.01); *H01L 29/78693* (2013.01)
USPC .......... 257/43; 257/59; 257/72; 257/E21.411; 257/E29.117; 257/E29.151; 257/E29.202; 257/E29.273; 438/149; 438/158; 438/159

(56) References Cited

U.S. PATENT DOCUMENTS

| | | | |
|---|---|---|---|
| 7,235,416 B2 * | 6/2007 | Oh | 438/22 |
| 7,439,089 B2 * | 10/2008 | Kim | 438/30 |
| 7,522,225 B2 * | 4/2009 | Lim | 349/43 |
| 7,652,422 B2 * | 1/2010 | Bae et al. | 313/506 |
| 7,652,740 B2 * | 1/2010 | Hwang et al. | 349/147 |
| 7,742,133 B2 * | 6/2010 | Ha et al. | 349/114 |
| 7,825,590 B2 * | 11/2010 | Park et al. | 313/506 |
| 8,183,762 B2 * | 5/2012 | Kim et al. | 313/504 |
| 8,258,022 B2 * | 9/2012 | Jung et al. | 438/149 |
| 8,377,762 B2 * | 2/2013 | Eguchi et al. | 438/155 |
| 8,486,739 B2 * | 7/2013 | Cho et al. | 438/30 |
| 8,492,862 B2 * | 7/2013 | Yamazaki et al. | 257/430 |
| 8,592,814 B2 * | 11/2013 | Yamazaki et al. | 257/59 |
| 8,654,272 B2 * | 2/2014 | Yamazaki et al. | 349/43 |
| 2010/0044709 A1 | 2/2010 | Nakayama et al. | |
| 2010/0102315 A1 | 4/2010 | Suzawa et al. | |
| 2010/0155719 A1 | 6/2010 | Sakata et al. | |
| 2010/0301329 A1 | 12/2010 | Asano et al. | |
| 2011/0018000 A1 * | 1/2011 | Choi et al. | 257/72 |
| 2011/0227075 A1 * | 9/2011 | Stainer et al. | 257/57 |
| 2012/0001170 A1 | 1/2012 | Yamazaki | |
| 2012/0112184 A1 * | 5/2012 | Yamazaki et al. | 257/43 |
| 2012/0220077 A1 | 8/2012 | Ha et al. | |

FOREIGN PATENT DOCUMENTS

| | | |
|---|---|---|
| CN | 101656232 A | 2/2010 |
| CN | 101901838 A | 12/2010 |
| CN | 102751240 A | 10/2012 |
| CN | 202601621 U | 12/2012 |
| JP | 20090128315 A | 12/2009 |
| JP | 2010-166038 A | 7/2010 |
| JP | 2012-033908 A | 2/2012 |
| KR | 1020060026621 A | 3/2006 |
| KR | 20100045920 A | 5/2010 |
| WO | 2011/151970 A1 | 12/2011 |

OTHER PUBLICATIONS

First Chinese Office Action dated Oct. 29, 2013; Appln. No. 201210181618.3.
Second Chinese Office Action dated Mar. 13, 2014; Appln. No. 201210181618.3.
Chinese Rejection Decision dated May 23, 2014; Appln. No. 201210181618.3.
Korea Notice of Allowance dated Aug. 26, 2014; Appln. No. 10-2013-7008588.

* cited by examiner

THIN FILM TRANSISTOR ARRAY SUBSTRATE AND METHOD FOR MANUFACTURING THE SAME

FIELD OF THE INVENTION

Embodiments of the present invention relate to a thin film transistor array substrate, a method for manufacturing the same, a display panel and a display device.

BACKGROUND

A Thin Film Transistor Liquid Crystal Display (briefly called as TFT-LCD) has characteristics of small volume, low power consumption, being free of radiation, etc., and plays a leading role in the current market for flat panel displays.

In recent years, the TFT-LCD has been developed rapidly, its size and resolution have been increased continually, and a liquid crystal television of large size and high resolution has become a mainstream of TFT-LCD development. With continual increasing of the size of the TFT-LCD and continual enhancement of its revolution, it is required that a driving circuit with a higher frequency is used in order to improve the display quality, and it is very hard for the mobility of existing amorphous silicon thin film transistors to meet requirements of the liquid crystal display. The mobility of amorphous silicon thin film transistors is generally about 0.5 $cm^2/V \cdot S$, but a mobility of 1 $cm^2/V \cdot S$ or above is needed when the size of the liquid crystal display exceeds 80 inches and its driving frequency is 120 Hz. Obviously, it is very hard for the mobility of existing amorphous silicon thin film transistors to meet this. A metal oxide TFT (amorphous IGZO) has a high mobility, a good uniformity and transparency, and its manufacturing process is simple. It can meet the demands of large-size liquid crystal displays and active organic electroluminescence better, and arouses more attention.

However, upon fabrication of the metal oxide TFT in prior art, a protective layer is generally added over a metal oxide, so as to avoid the metal oxide layer from being destroyed when source and drain metal electrodes are formed. As such, the number of patterning processes is increased, and the production efficiency is affected.

SUMMARY

A technical problem to be solved by embodiments of the invention is to provide a thin film transistor array substrate, a method for manufacturing the same, a display panel and a display device, capable of simplifying the manufacturing process of a metal oxide TFT array substrate and reducing the production cost of products.

For solving the above technical problem, the following technical solutions are provided by embodiments of the invention.

According to one aspect of the embodiments of the invention, there is provided a method for manufacturing a thin film transistor array substrate, comprising: sequentially depositing a first metal oxide layer, a second metal oxide layer and a source and drain metal layer, conductivity of the first metal oxide layer being smaller than conductivity of the second metal oxide layer; patterning the first metal oxide layer, the second metal oxide layer and the source and drain metal layer, so as to form an active layer, a buffer layer, a source electrode and a drain electrode.

For example, the patterning of the first metal oxide layer, the second metal oxide layer and the source and drain metal layer includes: applying photoresist on the source and drain metal layer; forming a completely-removed region, a completely-retained region corresponding to the source electrode and the drain electrode, and a partially-retained region corresponding to a channel area; etching off the source and drain metal layer, the first metal oxide layer and the second metal oxide layer in the completely-removed region; performing a photoresist ashing process so as to remove the photoresist in the partially-retained region; etching off the source and drain metal layer in the partially-retained region; etching off the second metal oxide layer in the partially-retained region; removing the photoresist in the completely-retained region, to thereby form the buffer layer comprising a source-electrode buffer layer and a drain-electrode buffer layer, and the source electrode and the drain electrode which are located on the source-electrode buffer layer and the drain-electrode buffer layer, respectively, and formed by the source and drain metal layer.

Further, after formation of the source electrode and the drain electrode, the method further comprises:
repairing a surface of the active layer at the channel area.

Further, the manufacturing method comprises: prior to deposition of the first metal oxide layer, the second metal oxide layer and the source and drain metal layer, forming patterns of a gate electrode and a gate scan line on a substrate and forming a gate insulating layer on the substrate with the patterns of the gate electrode and the gate scan line formed thereon; after patterning of the first metal oxide layer, the second metal oxide layer and the source and drain metal layer, forming a pattern of a passivation layer including a contact hole on the substrate with the patterns of the source electrode, the drain electrode and a data line formed thereon, and forming a pixel electrode which is connected to the drain electrode through the contact hole on the passivation layer.

According to an embodiment of the invention, there is further provided a thin film transistor array substrate, comprising: an active layer formed by a first metal oxide layer; a buffer layer formed by a second metal oxide layer, conductivity of the buffer layer being larger than conductivity of the active layer, the buffer layer including a source-electrode buffer layer and a drain-electrode buffer layer; and a source electrode and a drain electrode which are formed by a source and drain metal layer; wherein, the source-electrode buffer layer is located between the active layer and the source electrode, and the drain-electrode buffer layer is located between the active layer and the drain electrode.

Further, the buffer layer includes at least two metal oxide layers, and along a direction from being near the active layer to being far from the active layer, that is, with increasing of the distance from the active layer, conductivities of the metal oxide layers are gradually increased.

Further, the thin film transistor array substrate further comprises: a substrate, a gate electrode and a gate scan line which are located on the substrate and formed by a gate metal layer; a gate insulating layer located on the substrate with the gate electrode and the gate scan line formed thereon; the active layer located on the gate insulating layer; the source-electrode buffer layer and the drain-electrode buffer layer located on the active layer; the source electrode, the drain electrode and a data line, which are located on the source-electrode buffer layer and the drain-electrode buffer layer, respectively; a passivation layer which is located on the substrate with the source electrode, the drain electrode and the data line formed thereon and includes a contact hole; and a pixel electrode, which is located on the passivation layer and connected to the drain electrode through the contact hole.

Further, material for the buffer layer is amorphous IGZO.

Further, material for the active layer is amorphous IGZO, HIZO, IZO, a-InZnO, ZnO:F, $In_2O_3$:Sn, $In_2O_3$:Mo, $Cd_2SnO_4$, ZnO:Al, $TiO_2$:Nb or Cd—Sn—O.

According to an embodiment of the invention, there is further provided a display panel, comprising the above-mentioned thin film transistor array substrate.

According to an embodiment of the invention, there is further provided a display device, comprising the above-mentioned thin film transistor array substrate.

Embodiments of the invention have the following beneficial effects:

In the above schemes, with the second metal oxide layer having a high conductivity, not only the active layer can be protected upon etching of the source and drain metal layer, but also the buffer layer for reducing contact resistances of the source electrode and the drain electrode with the active layer can be eventually formed. Thus, the source electrode and drain electrode which are formed by the source and drain metal layer and the active layer are formed through one patterning process, and accordingly, it is possible that the patterning process is saved, the production efficiency is promoted, and the production cost of products is reduced.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

Figure 1:
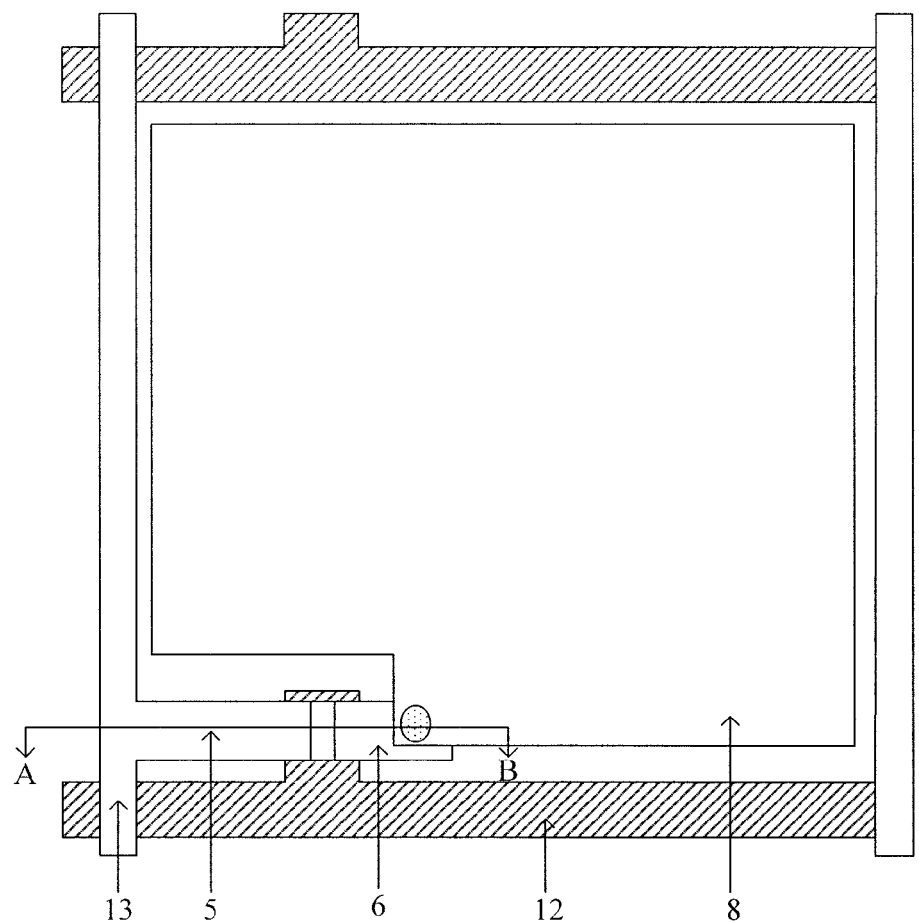
FIG. 1 is a schematic plan view showing a thin film transistor array substrate according to an embodiment of the invention.

REFERENCE NUMERALS 1 substrate
2 gate electrode
3 gate insulating layer
4-1 active layer
4-2 buffer layer
5 source electrode
6 drain electrode
7 passivation layer
8 pixel electrode
10 photoresist
12 gate scan line
13 data line

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Unless otherwise defined, the technical terminology or scientific terminology used herein should have the same meaning as commonly understood by one of ordinary skill in the art to which this invention belongs. Terms "first", "second" and the like used in specification and claims of the patent application of the invention do not show any order, number or importance, but are only used to distinguish different constituent parts. Likewise, a term "a," "an," or the like does not indicate limitation in number, but specifies the presence of at least one. A term "comprises," "comprising," "includes," "including," "contains" or the like means that an element or article ahead of this term encompasses element(s) or article(s) listed behind this term and its(their) equivalents, but does not preclude the presence of other elements or articles. A term "connection," "connected," or the like is not limited to physical or mechanical connection, but can include electrical connection, whether directly or indirectly. "Upper," "lower," "left," "right" or the like is only used to describe a relative positional relationship, and when an absolute position of the described object is changed, the relative positional relationship might also be changed accordingly.

An array substrate according to embodiments of the invention comprises a plurality of gate lines and a plurality of data lines, and these gate lines and data lines cross with each other to thereby define pixel units arranged in a matrix. Each pixel unit includes a thin film transistor functioning as a switch element and a pixel electrode for controlling arrangement of liquid crystals. For example, for the thin film transistor of each pixel, its gate electrode is electrically connected to or integrally formed with a corresponding gate line, its source electrode is electrically connected to or integrally formed with a corresponding data line, and its drain electrode is electrically connected to or integrally formed with a corresponding pixel electrode. The following descriptions are mainly made on a single pixel unit or a plurality of pixel units, but other pixel unit(s) can be formed in the same way.

Upon fabrication of a metal oxide TFT in prior art, a protective layer is generally added over a metal oxide, so as to avoid the metal oxide layer from being destroyed when source and drain metal electrodes are formed. As such, the number of patterning processes is increased, and the production efficiency is affected. For solving the above problem, according to embodiments of the invention, there are provided a thin film transistor array substrate, a method for manufacturing the same, a display panel and a display device, capable of simplifying the manufacturing process of a metal oxide TFT array substrate and reducing the production cost of products.

According to an embodiment of the invention, there is provided a method for manufacturing a thin film transistor array substrate, capable of forming an active layer which is formed by a metal oxide layer and a source electrode and a drain electrode which are formed by a source and drain metal layer through one patterning process.

Wherein, the step of forming the active layer, the source electrode and the drain electrode in this manufacturing method comprises:

a first metal oxide layer, a second metal oxide layer and a source and drain metal layer are sequentially deposited, conductivity of the first metal oxide layer being smaller than conductivity of the second metal oxide layer;

photoresist is applied on the source and drain metal layer;

a completely-removed region, a completely-retained region corresponding to the source electrode and the drain electrode, and a partially-retained region corresponding to a channel area are formed by performing exposure and development on the photoresist with a gray-tone or half-tone mask; after that, the source and drain metal layer, the first metal oxide layer and the second metal oxide layer in the completely-removed region are etched off, so as to form the active layer; a photoresist ashing process is carried out so as to remove the photoresist in the partially-retained region; next, the source and drain metal layer in the partially-retained region is etched off firstly, and the second metal oxide layer in the partially-retained region is etched off later, so as to form the channel area of a thin film transistor; the photoresist in the completely-retained region is removed, so as to form a buffer layer comprising a source-electrode buffer layer and a drain-electrode buffer layer, and the source electrode and the drain electrode which are located on the source-electrode buffer layer and the drain-electrode buffer layer, respectively, and formed by the source and drain metal layer.

Wherein, the buffer layer is located between the active layer and the source and drain metal layer and also formed by a metal oxide layer, and its object is to reduce contact resistances of the source electrode and the drain electrode with the active layer and meanwhile to protect the underlying active layer and promote performance of metal oxide TFTs. The buffer layer includes the source-electrode buffer layer which is located between the active layer and the source electrode and the drain-electrode buffer layer which is located between the active layer and the drain electrode.

The active layer is formed by a low-conductivity metal oxide layer, and the buffer layer is formed by a high-conductivity metal oxide layer. In the high-conductivity metal oxide layer, the content of oxygen is high, and the metal oxide layer has a good electric conductivity (Rs<$10^6$ Ω·mm$^2$/m), close to that of conductors; in the low-conductivity metal oxide layer, the content of oxygen is low, and the metal oxide layer has a poor electric conductivity ($10^6$ Ω·mm$^2$/m<Rs<$10^{11}$ Ω·mm$^2$/m), being a semiconductor. For example, the high-conductivity metal oxide layer may adopt amorphous indium gallium zinc oxide (IGZO). The low-conductivity metal oxide layer may adopt hafnium indium zinc oxide (HIZO), IZO, a-InZnO, ZnO:F, $In_2O_3$:Sn, $In_2O_3$:Mo, $Cd_2SnO_4$, ZnO:Al, $TiO_2$:Nb, Cd—Sn—O or other metal oxide.

For example, the buffer layer may be formed by at least two high-conductivity metal oxide layers, and along a direction from being near the active layer to being far from the active layer, conductivities of the at least two metal oxide layers are gradually increased.

For example, after the source electrode and the drain electrode are formed, a repair treatment may further be performed on a surface of the active layer at the channel area, so as to repair damage and contamination to the active layer upon etching. Specifically. $N_2O$ or $O_2$ plasma can be used to treat the surface of the active layer at the channel area. In one embodiment, a set of plasma process parameter ranges is: pressure: 100-2000 mT; radio frequency power: 500 W-4000 W; and flow rate of $N_2O$ gas: 500-3000 sccm.

For example, a method for manufacturing a thin film transistor array substrate according to an embodiment of the invention may comprises:

patterns of a gate electrode and a gate scan line are formed on a substrate;

a gate insulating layer is formed on the substrate with the patterns of the gate electrode and the gate scan line formed thereon;

a first metal oxide layer, a second metal oxide layer and a source and drain metal layer are sequentially deposited on the gate insulating layer, conductivity of the first metal oxide layer being smaller than conductivity of the second metal oxide layer;

photoresist is applied on the source and drain metal layer;

a completely-removed region, a completely-retained region corresponding to a source electrode, a drain electrode and a data line, and a partially-retained region corresponding to a channel area are formed by performing exposure and development on the photoresist with a gray-tone or half-tone mask; after that, the source and drain metal layer, the first metal oxide layer and the second metal oxide layer in the completely-removed region are etched off, so as to form the active layer; a photoresist ashing process is carried out so as to remove the photoresist in the partially-retained region; next, the source and drain metal layer in the partially-retained region is etched off firstly, and the second metal oxide layer in the partially-retained region is etched off later, so as to form the channel area of a thin film transistor; the photoresist in the completely-retained region is removed, so as to form a buffer layer comprising a source-electrode buffer layer and a drain-electrode buffer layer, and the source electrode, the drain electrode and the data line which are located on the source-electrode buffer layer and the drain-electrode buffer layer, respectively, and formed by the source and drain metal layer;

a pattern of a passivation layer including a contact via hole is formed on the substrate with the patterns of the source electrode, the drain electrode and the data line formed thereon;

a pixel electrode is formed on the passivation layer, so that the pixel electrode is connected to the drain electrode through the contact via hole.

In the method for manufacturing the thin film transistor array substrate according to the embodiment of the invention, with the second metal oxide layer having a high conductivity, not only the active layer can be protected upon etching of the source and drain metal layer, but also the buffer layer for reducing contact resistances of the source electrode and the drain electrode with the active layer can be eventually formed. Thus, the source electrode and drain electrode which are formed by the source and drain metal layer and the active layer can be formed through only one patterning process, and it is possible that the patterning process is saved, the production efficiency is promoted, and the production cost of products is reduced.

According to an embodiment of the invention, there is further provided a thin film transistor array substrate, comprising:

an active layer formed by a first metal oxide layer;

a buffer layer formed by a second metal oxide layer, conductivity of the buffer layer being larger than conductivity of the active layer, the buffer layer including a source-electrode buffer layer and a drain-electrode buffer layer; and a source electrode and a drain electrode which are formed by a source and drain metal layer;

wherein, the source-electrode buffer layer is located between the active layer and the source electrode, and the drain-electrode buffer layer is located between the active layer and the drain electrode.

Wherein, the buffer layer is located between the active layer and the source and drain metal layer and formed by a metal oxide layer, and its object is to reduce contact resistances of the source electrode and the drain electrode with the active layer and meanwhile to protect the active layer and promote performance of metal oxide TFTs.

Wherein, material for the active layer is a low-conductivity metal oxide layer, and material for the buffer layer is a high-conductivity metal oxide layer. In the high-conductivity metal oxide layer, the content of oxygen is high, and the metal oxide layer has a good electric conductivity ($Rs<10^6$ $\Omega \cdot mm^2/m$), close to that of conductors; in the low-conductivity metal oxide layer, the content of oxygen is low, and the metal oxide layer has a poor electric conductivity ($10^6$ $\Omega \cdot mm^2/m < Rs < 10^{11}$ $\Omega \cdot mm^2/m$), being a semiconductor. For example, the buffer layer may adopt amorphous IGZO, and the active layer may adopt HIZO, IZO, a-InZnO, ZnO:F, $In_2O_3$:Sn, $In_2O_3$:Mo, $Cd_2SnO_4$, ZnO:Al, $TiO_2$:Nb, Cd—Sn—O or other metal oxide.

For example, the buffer layer may be formed by at least two high-conductivity metal oxide layers, and along a direction from being near the active layer to being far from the active layer, conductivities of the at least two metal oxide layers are gradually increased.

The thin film transistor array substrate according to the embodiment of the invention will be further explained below in conjunction with a specific embodiment.

In the embodiment, configurations of a channel area, a source electrode, a drain electrode, a data line and so on are:

an active layer is formed by a first metal oxide layer;

a buffer layer formed by a second metal oxide layer is located on the active layer, conductivity of the buffer layer being larger than conductivity of the active layer, the buffer layer including a source-electrode buffer layer and a drain-electrode buffer layer; and a source electrode and a drain electrode which are formed by a source and drain metal layer are located on the source-electrode buffer layer and the drain-electrode buffer layer, respectively.

Figure 8:
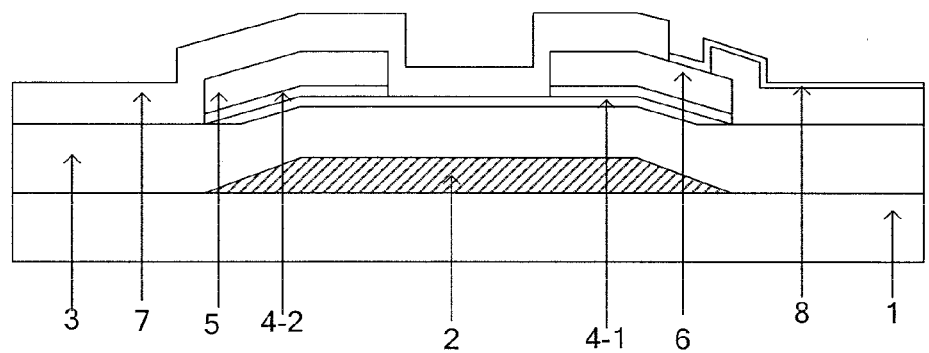
FIG. 8 is a schematic cross-sectional view showing a thin film transistor array substrate according to the embodiment of the invention in correspondence with the place A-B in FIG. 1.

The configuration of the thin film transistor array substrate, as shown in FIG. 1 and FIG. 8, may specifically comprise:

a substrate 1;

a gate electrode 2 and a gate scan line 12 which are located on the substrate 1 and formed by a gate metal layer;

a gate insulating layer 3 which is formed on the substrate 1 with the gate electrode 2 and the gate scan line 12 formed thereon;

an active layer 4-1 which is located on the gate insulating layer 3 and formed by a first metal oxide layer;

a source-electrode buffer layer and a drain-electrode buffer layer 4-2 which are located on the active layer 4-1 and aimed by a second metal oxide layer;

a source electrode 5, a drain electrode 6 and a data line 13 which are located on the source-electrode buffer layer and the drain-electrode buffer layer, respectively and formed by a source and drain metal layer;

a passivation layer 7 which is located on the substrate 1 with the source electrode 5, the drain electrode 6 and the data line 13 formed thereon and includes a contact hole;

a pixel electrode 8 which is located on the passivation layer 7 and is connected to the drain electrode 6 through the contact hole.

Hereinafter, a process for manufacturing the thin film transistor array substrate according to the embodiment will be described in detail, and the flow of this process comprises:

First patterning process: a substrate 1 which may be a glass substrate or a quartz substrate is provided, and the gate metal layer is deposited on the substrate 1 so as to form the gate electrode and the gate scan line.

Figure 2:
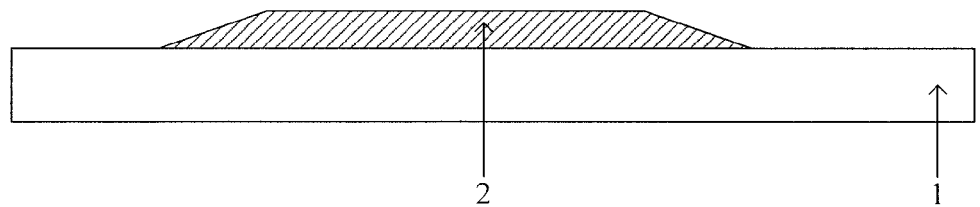
FIG. 2 is a schematic cross-sectional view in correspondence with the place A-B in FIG. 1 after a first patterning process of a method for manufacturing a thin film transistor array substrate according to an embodiment of the invention.

Specifically, a gate metal layer having a thickness in the range of 500-4000 Å may be deposited on the substrate 1 by means of sputtering or thermal evaporation. The gate metal layer may adopt at least one selected from a group composed of Cr, W, Ti, Ta, Mo, Al, Cu and other metals or alloys. The gate metal layer may be a single layer of a metal or a single layer of an alloy, and may also be a multilayer of metals or a multilayer of alloys. Photoresist is applied on the gate metal layer, and after the photoresist is exposed and developed with a mask, an etching process is performed so as to form the gate electrode 2 and the gate scan line 12. FIG. 2 is a schematically cross-sectional view showing the structure formed after it is subjected to the first patterning process.

Second patterning process: the gate insulating layer 3, the first metal oxide layer, the second metal oxide layer and the source and drain metal layer are sequentially deposited on the substrate 1 with the gate electrode 2 and the gate scan line 12 formed thereon.

Specifically, a gate insulating layer 3 having a thickness in the range of 2000-5000 Å may be deposited on the substrate 1 with the gate electrode 2 and the gate scan line 12 formed thereon by means of Plasma Enhanced Chemical Vapor Deposition (PECVD). An oxide, a nitride or an oxynitride may be used for the gate insulating layer 3, and corresponding reactant gases may be $SiH_4$, $NH_3$, and $N_2$, or $SiH_2Cl_2$, $NH_3$, and $N_2$. The gate insulating layer may be a single layer, and may also be a multilayer. Generally, that close to the metal oxide layers is an oxide gate insulating layer.

Then, a first metal oxide layer and a second metal oxide layer, each of which has a thickness in the range of 50-2000 Å, are consecutively deposited on the gate insulating layer 3 by means of sputtering, so that the active layer is formed by the first metal oxide layer and the buffer layer is formed by the second metal oxide layer. The buffer layer is located between the active layer and the source and drain metal layer and formed by the metal oxide layer, and its object is to reduce contact resistances of the source electrode and the drain electrode with the active layer and meanwhile to protect the underlying active layer upon formation of the source electrode and the drain electrode and promote performance of metal oxide TFTs.

Where, conductivity of the active layer is lower than conductivity of the buffer layer, and is close to that of semiconductors, and the buffer layer may be formed by at least one metal oxide layer. In case where the buffer layer is formed by two or more high-conductivity metal oxide layers, in a direction from being near the active layer to being far from the active layer, that is, with increasing of the distance from the active layer, conductivities of these two or more metal oxide layers are gradually increased. The active layer may include multiple layers, for example, it may include a plurality of metal oxide layers. For example, the active layer may include three metal oxide layers, which are a first metal oxide layer, a second metal oxide layer and a third metal oxide layer in this order, where conductivity of the first metal oxide layer is smaller than conductivity of the second metal oxide layer, and conductivity of the second metal oxide layer is smaller than conductivity of the third metal oxide layer.

The embodiment is specifically described with reference to an example in which the buffer layer only includes one metal oxide layer. In the embodiment, two metal oxide layers are consecutively deposited on the gate insulating layer 3, the metal oxide layer deposited earlier has a lower conductivity and can be used to form the active layer 4-1, and the metal oxide layer deposited later has a higher conductivity and can be used to form the buffer layer 4-2. If three or more metal oxide layers are deposited on the gate insulating layer 3, then the lowest metal oxide layer is used to form the active layer, and the remaining metal oxide layers are used to form the buffer layer.

Conductivity of a metal oxide layer can be effectively controlled by controlling the content of oxygen upon deposition of the metal oxide layer. If the content of oxygen in a metal oxide layer is high, then the metal oxide layer has good electric conductivity ($Rs<10^6$ $\Omega \cdot mm^2/m$), close to that of conductors; if the content of oxygen in a metal oxide layer is low, then the metal oxide layer has poor electric conductivity ($10^6$ $\Omega \cdot mm^2/m<Rs<10^{11}$ $\Omega \cdot mm^2/m$), being a semiconductor. Specifically, the second metal oxide layer may adopt amorphous IGZO, and the first metal oxide layer may adopt amorphous IGZO, HIZO, IZO, a-InZnO, $ZnO$:F, $In_2O_3$:Sn, $In_2O_3$:Mo, $Cd_2SnO_4$, $ZnO$:Al, $TiO_2$:Nb, Cd—Sn—O or other metal oxide. Afterwards, the source and drain metal layer is deposited on the second metal oxide layer. Specifically, a source and drain metal layer, which has a thickness in the range of 2000-4000 Å and may adopt at least one selected from a group composed of Cr, W, Ti, Ta, Mo and other metals and alloys, may be deposited by means of sputtering or thermal evaporation. It may be a single-layered metal thin film or a single-layered alloy thin film, and may also be a multilayered metal thin film or a multilayered alloy thin film.

Figure 3:
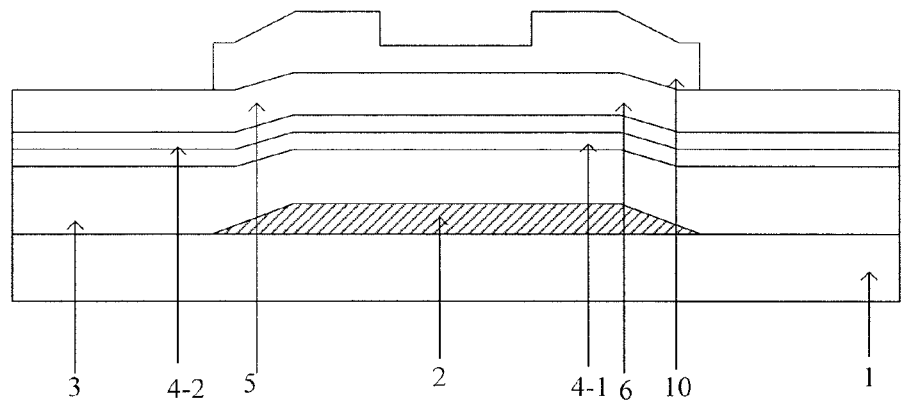
FIG. 3 is a schematic cross-sectional view in correspondence with the place A-B in FIG. 1 after exposure and development in a second patterning process of the method for manufacturing the thin film transistor array substrate according to the embodiment of the invention.
Figure 4:
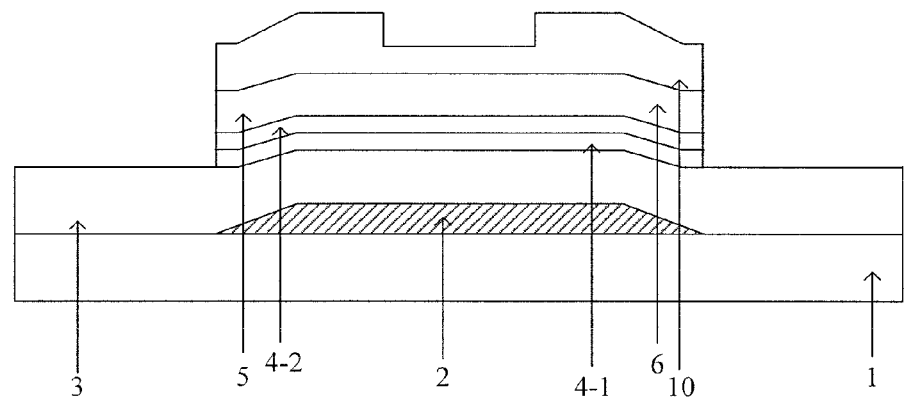
FIG. 4 is a schematic cross-sectional view in correspondence with the place A-B in FIG. 1 after a first etching in the second patterning process of the method for manufacturing the thin film transistor array substrate according to the embodiment of the invention.
Figure 5:
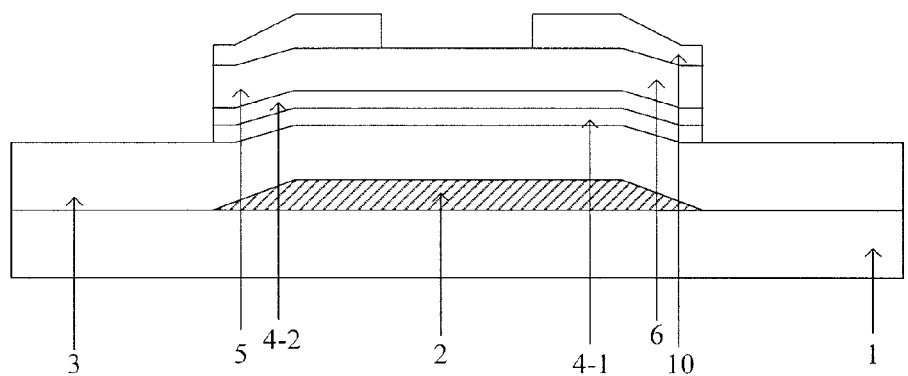
FIG. 5 is a schematic cross-sectional view in correspondence with the place A-B in FIG. 1 after ashing in the second patterning process of the method for manufacturing the thin film transistor array substrate according to the embodiment of the invention.

After photoresist is applied and subjected to an exposure and development with a gray-tone or half-tone mask, a completely-removed region, a partially-retained region and a completely-retained region are formed. As shown in FIG. 3, the completely-retained region corresponds to the source and drain metal electrodes and the data line, and the partially-retained region corresponds to a channel area of a TFT. A first etch process is performed, so that the source and drain metal layer, the first metal oxide layer and the second metal oxide layer in the completely-removed region are etched off and accordingly, the active layer 4-1 is formed; next, a photoresist ashing process is carried out, so that the photoresist 10 in the partially-retained region is removed and the structure shown in FIG. 5 is formed; and subsequently, a second etch process is performed further, so that the source and drain metal layer in the partially-retained region is etched off firstly, and the second metal oxide layer in the partially-retained region is etched off later and accordingly the channel of the TFT is formed between the source electrode and the drain electrode. During etching of the second metal oxide layer in the partially-retained region, a part of the first metal oxide layer can be etched off in order to make sure that the second metal oxide layer is etched off completely.

In the embodiment, the buffer layer 4-2 contacts the source and drain metal layer directly. With such a design, it is possible that contact resistances of the active layer 4-1 with the source electrode and the drain electrode are reduced, and a switch-on current of the metal oxide TFT is promoted. The active layer 4-1 contacts the gate insulating layer 3 directly, and forming the active layer with the use of the metal oxide layer which has a low content of oxygen allows performance of the TFT to be more stable.

Further, in order to enhance performance of the metal oxide TFT, a treatment can be conducted on a surface of the active layer at the channel area, so as to repair damage and contamination to the active layer upon etching. Specifically, $N_2O$ or $O_2$ plasma can be used to treat the surface of the active layer at the channel area. With a 5 G production line as an example, a set of plasma process parameter ranges is: pressure: 100-2000 mT; radio frequency power: 500 W-4000 W; and flow rate of $N_2O$ gas: 500-3000 sccm. In terms of apparatuses in different production lines, process parameters differ, but the thought of treatment is the same.

Figure 6:
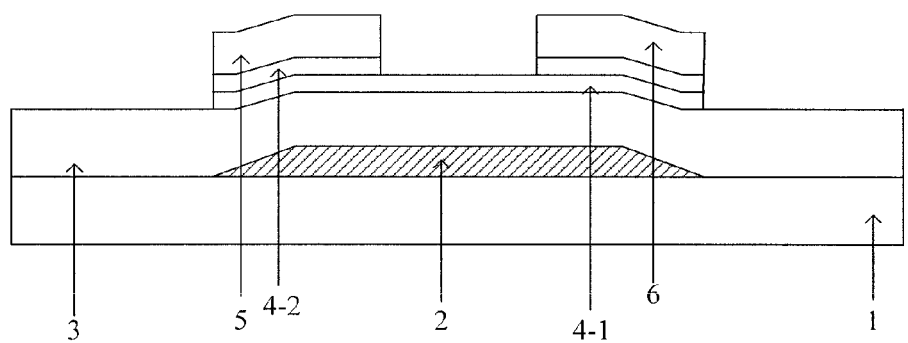
FIG. 6 is a schematic cross-sectional view in correspondence with the place A-B in FIG. 1 after the second patterning process of the method for manufacturing the thin film transistor array substrate according to the embodiment of the invention.

Afterwards, the residual photoresist 10 is removed, so as to form the buffer layer 4-2 including the source-electrode buffer layer and the drain-electrode buffer layer, the source electrode 5, the drain electrode 6 and the data line 13. The structure which is finally formed after the second patterning process is shown in FIG. 6.

Figure 7:
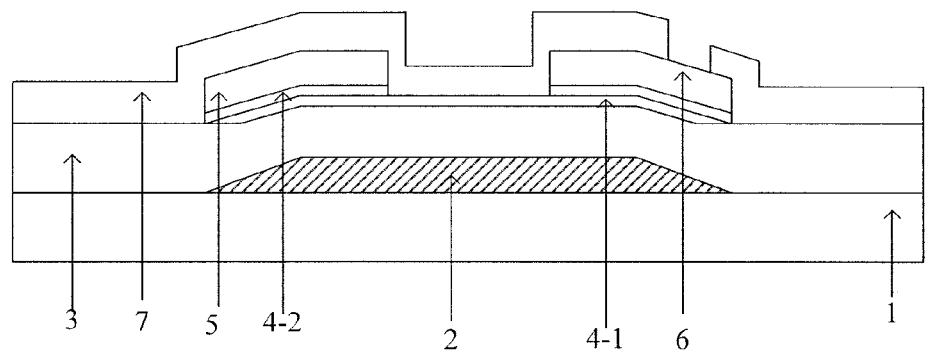
FIG. 7 is a schematic cross-sectional view in correspondence with the place A-B in FIG. 1 after a first etching in a third patterning process of the method for manufacturing the thin film transistor array substrate according to the embodiment of the invention.

A third patterning process: the passivation layer 7 is deposited on the substrate 1 subjected to the second patterning process. Specifically, a passivation layer 7, which has a thickness in the range of 2000-5000 Å and may adopt an oxide, a nitride or an oxynitride, is deposited by means of PECVD. The passivation layer 7 may be a single-layered structure, and may also be a multilayered structure, and corresponding reactant gases may be $SiH_4$, $NH_3$, and $N_2$, or $SiH_2Cl_2$, $NH_3$, and $N_2$. Photoresist is applied on the passivation layer, and after the photoresist is exposed and developed with a mask, an etch process is performed so as to form the pattern of the passivation layer 7 including the contact via hole. FIG. 7 is a schematically cross-sectional view showing the structure formed after the third patterning process.

A fourth patterning process: a transparent conductive layer is deposited on the substrate 1 subjected to the third patterning process. Specifically, a transparent conductive layer, which has a thickness in the range of 300-1500 Å and may adopt ITO, IZO or other transparent metal oxide, can be formed on the substrate 1 with the passivation layer 7 formed thereon by means of sputtering or thermal evaporation. Photoresist is applied on the transparent conductive layer, and after the photoresist is exposed and developed with a mask, an etch process is performed to form the pixel electrode 8 which is connected to the drain electrode 6 through the contact via hole.

FIG. 8 is a schematically cross-sectional view showing the thin film transistor array substrate formed after the fourth patterning process, and FIG. 1 is a schematic plan view showing the thin film transistor array substrate after the fourth patterning processes.

In the embodiment, with the second metal oxide layer having a high conductivity, not only the active layer can be protected upon etching of the source and drain metal layer, but also the buffer layer for reducing contact resistances of the source electrode and the drain electrode with the active layer can be eventually formed. Thus, the active layer, the source electrode and drain electrode can be formed through one patterning process, and accordingly, it is possible that the patterning process is saved, the production efficiency is promoted, and the production cost of products is reduced. In addition, in the technical solution of the embodiment of the invention, on the gate insulating layer are formed two or more metal oxide layers with the bottom layer being the active layer and other layer(s) being the buffer layer, and a part of the buffer layer is etched off upon formation of the source electrode and the drain electrode so as to form the channel. With such a design, contact resistances of the source electrode and the drain electrode with the active layer can be reduced, and moreover, performance of the metal oxide TFT can be enhanced because the active layer is protected by the buffer layer.

According to an embodiment of the invention, there is further provided a display panel, comprising the thin film transistor array substrate stated as above.

According to an embodiment of the invention, there is further provided a display device, comprising the thin film transistor array substrate stated as above. Specifically, the display device may be applied to liquid crystal display, tablet computer or other electronic devices.

The foregoing is merely exemplary embodiments of the invention, but not used to limit the protection scope of the invention. The protection scope of the invention shall be defined by the attached claims.

What is claimed is:

1. A method for manufacturing a thin film transistor array substrate, comprising:
   sequentially depositing a first metal oxide layer, a second metal oxide layer and a source and drain metal layer, conductivity of the first metal oxide layer being smaller than conductivity of the second metal oxide layer; and
   patterning the first metal oxide layer, the second metal oxide layer and the source and drain metal layer, so as to form an active layer, a buffer layer, a source electrode and a drain electrode, respectively.

2. The method for manufacturing the thin film transistor array substrate of claim 1, wherein, the patterning of the first metal oxide layer, the second metal oxide layer and the source and drain metal layer comprises:
   applying photoresist on the source and drain metal layer;
   forming a completely-removed region, a completely-retained region corresponding to the source electrode and the drain electrode, and a partially-retained region corresponding to a channel area;
   etching off the source and drain metal layer, the first metal oxide layer and the second metal oxide layer in the completely-removed region;
   performing a photoresist ashing process so as to remove the photoresist in the partially-retained region;
   etching off the source and drain metal layer in the partially-retained region;
   etching off the second metal oxide layer in the partially-retained region; and
   removing the photoresist in the completely-retained region.

3. The method for manufacturing the thin film transistor array substrate of claim 2, wherein, after formation of the source electrode and the drain electrode, the method further comprises:
   repairing a surface of the active layer at the channel area.

4. The method for manufacturing the thin film transistor array substrate of claim 3, wherein, the manufacturing method comprises:
   prior to deposition of the first metal oxide layer, the second metal oxide layer and the source and drain metal layer, forming patterns of a gate electrode and a gate scan line on a substrate and forming a gate insulating layer on the substrate with the patterns of the gate electrode and the gate scan line formed thereon;
   simultaneously with the formation of the source electrode and the drain electrode, forming a data line with the source and drain metal layer, the data line being connected to the source electrode, and
   after patterning of the first metal oxide layer, the second metal oxide layer and the source and drain metal layer, forming a pattern of a passivation layer including a contact hole on the substrate with the patterns of the source electrode, the drain electrode and the data line formed thereon, and forming a pixel electrode which is connected to the drain electrode through the contact hole on the passivation layer.

5. The method for manufacturing the thin film transistor array substrate of claim 2, wherein, the manufacturing method comprises:
   prior to deposition of the first metal oxide layer, the second metal oxide layer and the source and drain metal layer, forming patterns of a gate electrode and a gate scan line on a substrate and forming a gate insulating layer on the substrate with the patterns of the gate electrode and the gate scan line formed thereon;
   simultaneously with the formation of the source electrode and the drain electrode, forming a data line with the source and drain metal layer, the data line being connected to the source electrode, and
   after patterning of the first metal oxide layer, the second metal oxide layer and the source and drain metal layer, forming a pattern of a passivation layer including a contact hole on the substrate with the patterns of the source electrode, the drain electrode and the data line formed thereon, and forming a pixel electrode which is connected to the drain electrode through the contact hole on the passivation layer.

6. The method for manufacturing the thin film transistor array substrate of claim 1, wherein, the manufacturing method comprises:
   prior to deposition of the first metal oxide layer, the second metal oxide layer and the source and drain metal layer, forming patterns of a gate electrode and a gate scan line on a substrate and forming a gate insulating layer on the substrate with the patterns of the gate electrode and the gate scan line formed thereon;
   simultaneously with the formation of the source electrode and the drain electrode, forming a data line with the source and drain metal layer, the data line being connected to the source electrode; and
   after patterning of the first metal oxide layer, the second metal oxide layer and the source and drain metal layer, forming a pattern of a passivation layer including a contact hole on the substrate with the patterns of the source electrode, the drain electrode and the data line formed thereon, and forming a pixel electrode which is connected to the drain electrode through the contact hole on the passivation layer.

7. A thin film transistor array substrate, comprising:
   an active layer formed by a first metal oxide layer;
   a buffer layer formed by a second metal oxide layer, conductivity of the buffer layer being larger than conductivity of the active layer, the buffer layer including a source-electrode buffer layer and a drain-electrode buffer layer; and
   a source electrode and a drain electrode which are formed by a source and drain metal layer;
   wherein, the source-electrode buffer layer is located between the active layer and the source electrode, and the drain-electrode buffer layer is located between the active layer and the drain electrode.

8. The thin film transistor array substrate of claim 7, wherein, the buffer layer includes at least two metal oxide layers, and with increasing of the distance from the active layer, conductivities of the metal oxide layers are gradually increased.

9. The thin film transistor array substrate of claim 8, further comprising:
a substrate,
a gate electrode and a gate scan line which is located on the substrate and formed by a gate metal layer;
a gate insulating layer located on the substrate with the gate electrode and the gate scan line formed thereon;
the active layer located on the gate insulating layer;
the source-electrode buffer layer and the drain-electrode buffer layer located on the active layer;
the source electrode and the drain electrode, which are located on the source-electrode buffer layer and the drain-electrode buffer layer, respectively;
a data line located in the same layer with the source electrode and the drain electrode and connected to the source electrode;
a passivation layer which is located on the substrate with the source electrode, the drain electrode and the data line formed thereon and includes a contact hole; and
a pixel electrode, which is located on the passivation layer and connected to the drain electrode through the contact hole.

10. The thin film transistor array substrate of claim 9, wherein, material for the buffer layer is amorphous IGZO.

11. The thin film transistor array substrate of claim 9, wherein, material for the active layer is amorphous IGZO, HIZO, IZO, a-InZnO, ZnO:F, $In_2O_3$:Sn, $In_2O_3$:Mo, $Cd_2SnO_4$, ZnO:Al, $TiO_2$:Nb or Cd—Sn—O.

12. The thin film transistor array substrate of claim 8, wherein, material for the buffer layer is amorphous IGZO.

13. The thin film transistor array substrate of claim 8, wherein, material for the active layer is amorphous IGZO, HIZO, IZO, a-InZnO, ZnO:F, $In_2O_3$:Sn, $In_2O_3$:Mo, $Cd_2SnO_4$, ZnO:Al, $TiO_2$:Nb or Cd—Sn—O.

14. The thin film transistor array substrate of claim 7, further comprising:
a substrate,
a gate electrode and a gate scan line which is located on the substrate and formed by a gate metal layer;
a gate insulating layer located on the substrate with the gate electrode and the gate scan line formed thereon;
the active layer located on the gate insulating layer;
the source-electrode buffer layer and the drain-electrode buffer layer located on the active layer;
the source electrode and the drain electrode, which are located on the source-electrode buffer layer and the drain-electrode buffer layer, respectively;
a data line located in the same layer with the source electrode and the drain electrode and connected to the source electrode;
a passivation layer which is located on the substrate with the source electrode, the drain electrode and the data line formed thereon and includes a contact hole; and
a pixel electrode, which is located on the passivation layer and connected to the drain electrode through the contact hole.

15. The thin film transistor array substrate of claim 14, wherein, material for the buffer layer is amorphous IGZO.

16. The thin film transistor array substrate of claim 14, wherein, material for the active layer is amorphous IGZO, HIZO, IZO, a-InZnO, ZnO:F, $In_2O_3$:Sn, $In_2O_3$:Mo, $Cd_2SnO_4$, ZnO:Al, $TiO_2$:Nb or Cd—Sn—O.

17. The thin film transistor array substrate of claim 7, wherein, material for the buffer layer is amorphous IGZO.

18. The thin film transistor array substrate of claim 7, wherein, material for the active layer is amorphous IGZO, HIZO, IZO, a-InZnO, ZnO:F, $In_2O_3$:Sn, $In_2O_3$:Mo, $Cd_2SnO_4$, ZnO:Al, $TiO_2$:Nb or Cd—Sn—O.

19. A display panel, comprising the thin film transistor array substrate of claim 7.

* * * * *